US012721055B2

(12) United States Patent
Yu et al.

(10) Patent No.: US 12,721,055 B2
(45) Date of Patent: Aug. 25, 2026

(54) EPITAXIES OF A CHEMICAL COMPOUND SEMICONDUCTOR

(71) Applicants: Taiwan Semiconductor Manufacturing Company Limited, Hsinchu (TW); National Chiao-Tung University, Hsinchu (TW)

(72) Inventors: Hung-Wei Yu, Yilan County (TW); Yi Chang, Hsinchu County (TW); Tsun-Ming Wang, New Taipei City (TW)

(73) Assignees: Taiwan Semiconductor Manufacturing Company Limited, Hsinchu (TW); National Chiao-Tung University, Hsinchu (TW)

( * ) Notice: Subject to any disclaimer, the term of this patent is extended or adjusted under 35 U.S.C. 154(b) by 77 days.

(21) Appl. No.: 18/770,783

(22) Filed: Jul. 12, 2024

(65) Prior Publication Data

US 2024/0363344 A1 Oct. 31, 2024

Related U.S. Application Data

(60) Continuation of application No. 17/873,274, filed on Jul. 26, 2022, now Pat. No. 12,062,541, which is a continuation of application No. 17/093,865, filed on Nov. 10, 2020, now Pat. No. 11,437,235, which is a division of application No. 16/101,568, filed on Aug. 13, 2018, now Pat. No. 10,854,446, which is a division of application No. 15/063,572, filed on Mar. 8, 2016, now Pat. No. 10,049,872, which is a (Continued)

(51) Int. Cl.

| | |
|---|---|
| ***H01L 21/02*** | (2006.01) |
| ***H10D 62/17*** | (2025.01) |
| ***H10D 62/824*** | (2025.01) |
| ***H10P 14/20*** | (2026.01) |
| ***H10P 14/24*** | (2026.01) |
| *H10D 30/47* | (2025.01) |

(52) U.S. Cl.

CPC ........... *H10P 14/24* (2026.01); *H10D 62/235* (2025.01); *H10D 62/824* (2025.01); *H10P 14/2905* (2026.01); *H10P 14/2911* (2026.01); *H10P 14/3221* (2026.01); *H10P 14/3248* (2026.01); *H10P 14/3254* (2026.01); *H10P 14/3421* (2026.01); *H10P 14/3422* (2026.01); *H10D 30/472* (2025.01)

(58) Field of Classification Search

None

See application file for complete search history.

(56) References Cited

U.S. PATENT DOCUMENTS

| | | | | |
|---|---|---|---|---|
| 6,992,319 | B2 | 1/2006 | Fahimulla et al. | |
| 9,773,896 | B2 * | 9/2017 | Lutgen | H10D 62/8503 |

(Continued)

*Primary Examiner* — Long Pham

(74) *Attorney, Agent, or Firm* — Jones Day

(57) ABSTRACT

Methods and structures includes providing a substrate, forming a prelayer over a substrate, forming a barrier layer over the prelayer, and forming a channel layer over the barrier layer. Forming the prelayer may include growing the prelayer at a graded temperature. Forming the barrier layer is such that the barrier layer may include GaAs or InGaAs. Forming the channel layer is such that the channel layer may include InAs or an Sb-based heterostructure. Thereby structures are formed.

20 Claims, 2 Drawing Sheets

Related U.S. Application Data continuation of application No. 14/452,608, filed on Aug. 6, 2014, now Pat. No. 9,287,122.

(60) Provisional application No. 61/953,963, filed on Mar. 17, 2014.

(56) References Cited

U.S. PATENT DOCUMENTS

| | | | |
|---|---|---|---|
| 11,533,024 | B2 | 12/2022 | Lim et al. |
| 2001/0035530 | A1 | 11/2001 | Udagawa |
| 2007/0243414 | A1 | 10/2007 | Miki |
| 2008/0230849 | A1 | 9/2008 | Afzali-Ardakani et al. |
| 2009/0321717 | A1 | 12/2009 | Pillarisetty et al. |
| 2011/0279146 | A1 | 11/2011 | Koo et al. |
| 2013/0161698 | A1* | 6/2013 | Marino ................ H10D 64/517 257/E21.403 |
| 2014/0004674 | A1 | 1/2014 | Ando et al. |
| 2014/0191252 | A1 | 7/2014 | Lee et al. |
| 2014/0209979 | A1* | 7/2014 | Lau .................. H01L 21/02543 257/194 |
| 2015/0050800 | A1 | 2/2015 | Brand et al. |
| 2016/0005700 | A1 | 1/2016 | Rogers et al. |
| 2016/0155817 | A1 | 6/2016 | Wang et al. |

* cited by examiner

122 PROVIDE AN EPI-READY WAFER, e.g., A GaAs/Ge/(Si) SUBSTRATE

124 PROVIDE A GRADED-TEMPERATURE ARSENIC PRELAYER GROWN AT GRADED TEMPERATURE OF 300° TO 550° C

126 PROVIDE AN InGaAs/GaAs BARRIER ON THE PRELAYER

128 PROVIDE A HIGH-RELAXATION AND SMOOTH InAs THIN FILM OR Al(In)Sb/InAs/Al(In)Sb THIN FILM CHANNEL LAYER

EPITAXIES OF A CHEMICAL COMPOUND SEMICONDUCTOR

CROSS-REFERENCE TO RELATED APPLICATION

The present application is a continuation application of U.S. patent application Ser. No. 17/873,274, filed on Jul. 26, 2022, which is a continuation application of U.S. patent application Ser. No. 17/093,865, filed on Nov. 10, 2020; which is a divisional application of U.S. patent application Ser. No. 16/101,568, filed on Aug. 13, 2018, which has issued as U.S. Pat. No. 10,854,446; which is a divisional application of U.S. patent application Ser. No. 15/063,572, filed on Mar. 8, 2016, which has issued as U.S. Pat. No. 10,049,872; which is a continuation of U.S. patent application Ser. No. 14/452,608, filed on Aug. 6, 2014, which has issued as U.S. Pat. No. 9,287,122; which claims priority from U.S. Provisional Application No. 61/953,963, filed on Mar. 17, 2014; all of which are hereby incorporated into the present application by reference in their entirety.

BACKGROUND

The technology described in this patent document relates to chemical compound semiconductors, and more specifically to forming a chemical compound semiconductor layer on a substrate.

Scaling of semiconductor devices, such as a MOSFET, has enabled continued improvement in speed, performance, density, and cost per unit function of integrated circuits over the past few decades. Improvements to the processes used in fabricating semiconductor structures can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
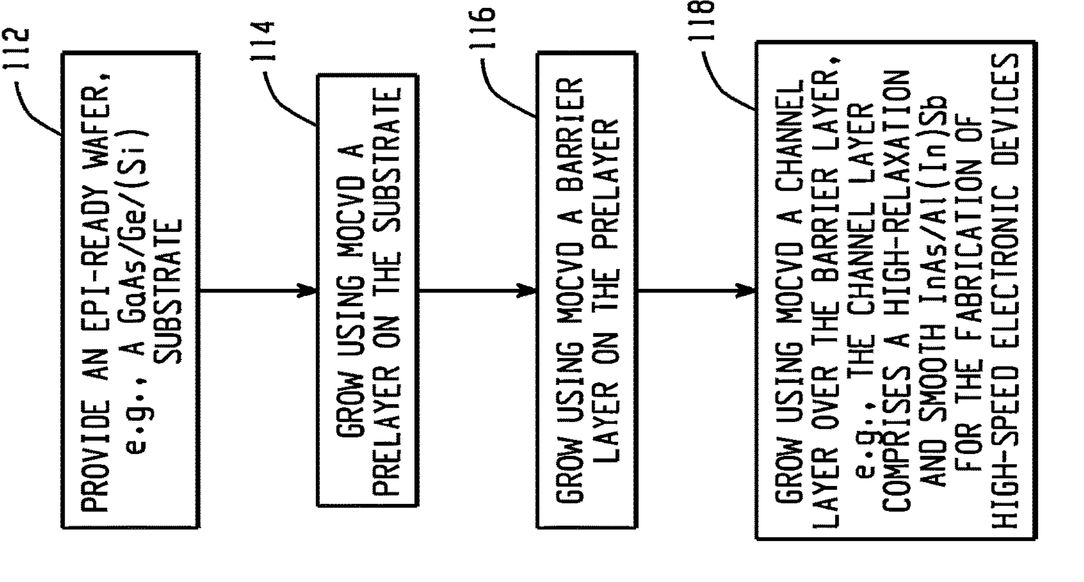
FIG. 2 depicts another example process flow chart for creating a wafer that may be used in a semiconductor fabrication process.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Disclosed herein are structures and methods for growing type III-V materials as semiconductor layers on epi-ready wafers using MOCVD operations. In some examples, disclosed are techniques to grow In(Ga)As (or Al(Ga,In)Sb) epitaxy with high In content (~100%) or low In content on a GaAs substrate, a Ge substrate, a Si substrate and a Ge/Si substrate.

Figure 1:
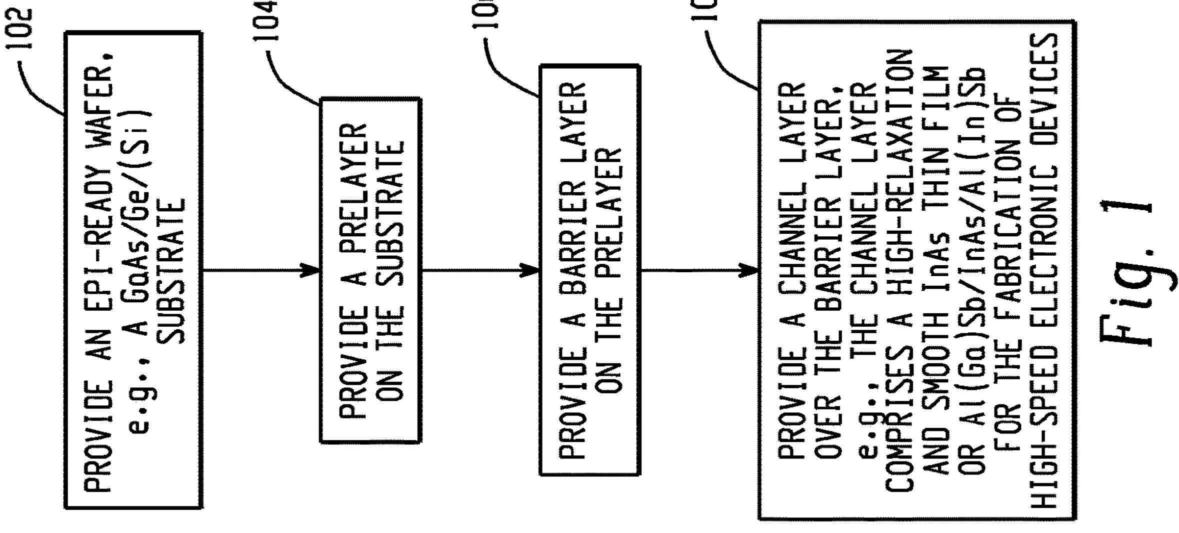
FIG. 1 depicts an example process flow chart for creating a wafer that may be used in a semiconductor fabrication process.

FIG. 1 depicts an example process flow chart for creating a wafer having a chemical compound semiconductor channel layer on a substrate that may be used in a semiconductor fabrication process. The example process comprises providing an epi-ready wafer, such as one comprising a GaAs substrate, a Ge substrate, a Si substrate, or a Ge/Si substrate (operation 102). A prelayer is provided over the substrate (operation 104). Next, a barrier layer is provided over the prelayer (operation 106). Then, a chemical compound semiconductor channel layer is provided over the barrier layer (operation 108). The example channel layer comprises a high-relaxation and smooth InAs thin film or In(Ga)As or Al(Ga)Sb/InAs/Al(Ga)Sb thin film for use in subsequent fabrication of high-speed electronic devices. This example process may allow for the use of a cheaper substrate, such as a Si, Ge, GaAs or Ge/Si substrate, instead of a GaSb or InP substrate and allow for In(Ga)As or Al(Ga)Sb/InAs/Al(Ga)Sb epilayers to be grown on the cheaper substrates.

FIG. 2 depicts another example process flow chart for creating a wafer having a chemical compound semiconductor channel layer on a substrate that may be used in a semiconductor fabrication process. The example process of FIG. 2 is similar to the example process of FIG. 1 and illustrates that each of the prelayer, barrier layer, and channel layer can be provided using metal organic chemical vapor deposition (MOCVD) operations. After providing an epi-reading wafer, such as one comprising a GaAs substrate, a Ge substrate, a Si substrate, or a Ge/Si substrate (operation 112), a prelayer is grown over the substrate using MOCVD operations (operation 114). Next, a barrier layer is grown over the prelayer using MOCVD operations (operation 116). Then, a chemical compound semiconductor channel layer is grown over the barrier layer using MOCVD operations (operation 118). The example channel layer comprises a high-relaxation and smooth InAs thin film or In(Ga)As or Al(Ga)Sb/InAs/Al(Ga)Sb thin film for use in subsequent fabrication of high-speed electronic devices. This example process may allow for the use of a cheaper substrate, such as a Si, Ge, GaAs, or Ge/Si substrate, instead of a GaSb or InP substrate and allow for In(Ga)As or Al(Ga)Sb/InAs/Al(Ga)Sb epilayers to be grown on the cheaper substrates.

Figures 3, 4:
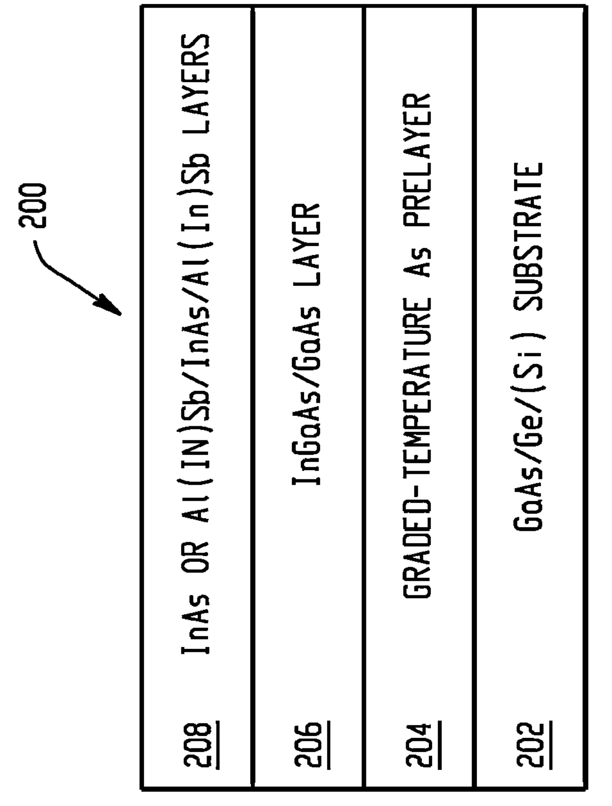
FIG. 3 depicts another example process flow chart for creating a wafer that may be used in a semiconductor fabrication process.
FIG. 4 depicts a cross-sectional view of an example wafer that may be used in a semiconductor fabrication process.

FIG. 3 depicts another example process flow chart for creating a wafer having a chemical compound semiconductor channel layer on a substrate that may be used in a semiconductor fabrication process. In the example process of FIG. 3, after providing an epi-ready wafer, such as one comprising a GaAs substrate, a Ge substrate, a Si substrate, or a Ge/Si substrate (operation 122), a graded-temperature arsenic prelayer is grown over the substrate using MOCVD operations (operation 124). The graded-temperature arsenic prelayer may be grown at a graded temperature ramped from 300 to 550° C. In this example, the prelayer thickness is several nanometers but less than 10 nm.

Next, a barrier layer is grown over the prelayer using MOCVD operations (operation 126). The barrier layer in this example consists of a GaAs with low-growth-temperature growth or an $In_xGa_{1-x}As$ epitaxy with one or multiple GaAs-based layers. The thickness of the barrier layer(s) in this example is about 5-500 nm. Also, the barrier layer(s) is slightly P or N-type (~$10^{17}$ $cm^{-3}$).

Then, an InAs or Sb-based channel layer is grown over the barrier layer using MOCVD operations (operation 128). The example channel layer comprises an InAs epitaxy with low-growth-temperature growth or Al(In)Sb/InAs/Al(In)Sb heterostructures with one or more pairs deposited at a temperature of about 300~600 degree. In this example, the channel thickness is about 20-500 nm.

By using the example processes of FIGS. 1, 2, and 3, periodic 90° misfit dislocations may be generated between the barrier and channel layers to relax the strain. The channel layer of the devices generated using the examples of FIG. 1, 2, or 3 may be used in a semiconductor fabrication process for fabricating, for example, a high electron mobility transistor (HEMT), a field-effect transistor (FET), a tunneling field-effect transistor (TFET), a fin field-effect transistor (FinFET), a metal-oxide-semiconductor field-effect transistor (MOSFET), and/or a heterojunction bipolar transistor (HBT).

FIG. 4 depicts a cross-sectional view of an example wafer 200 that may be used in a semiconductor fabrication process. The example wafer 200 comprises a substrate 202. In this example, the substrate 202 comprises a GaAs substrate, a Ge substrate, a Si substrate, or a Ge/Si substrate.

The example wafer 200 further comprises an arsenic (As) prelayer 204 formed over the substrate 202. The arsenic prelayer 204, in this example, is a graded-temperature arsenic prelayer that may be grown at a graded temperature ramped from 300 to 550° C. In this example, the prelayer thickness is several nanometers but less than 10 nm.

A barrier layer 206 is formed above the arsenic prelayer 204. The barrier layer 206 in this example is grown over the prelayer using MOCVD operations. The barrier layer 206 in this example consists of a GaAs with low-growth-temperature growth or an $In_xGa_{1-x}As$ epitaxy with one or multiple GaAs-based layers. The thickness of the barrier layer(s) in this example is about 5-500 nm. Also, the barrier layer(s) is slightly P or N-type (~$10^{17}$ $cm^{-3}$).

An InAs or Sb-based channel layer 208 is grown over the barrier layer 206. The example channel layer comprises an InAs epitaxy with low-growth-temperature growth or Al(In)Sb/InAs/Al(In)Sb heterostructures with one or more pairs deposited at a temperature of about 300~600° C. In this example, the channel thickness is about 20-500 nm.

The channel layer can be used for the deposition of high-performance electron devices such as tunneling field-effect transistor (TFET). The wafer 200 may be used in a semiconductor fabrication process for fabricating, for example, a high electron mobility transistor (HEMT), a field-effect transistor (FET), a tunneling field-effect transistor (TFET), a fin field-effect transistor (FinFET), a metal-oxide-semiconductor field-effect transistor (MOSFET), and/or a heterojunction bipolar transistor (HBT).

The use of the disclosed techniques may allow for a lattice mismatch between In(Ga)As and GaAs epilayers of about 7.2%. The relaxation degree between InAs and GaAs epilayers using techniques described herein may reach>90%.

The growth techniques disclosed herein may obviate the need for a graded buffer layer, and allow for high-relaxation In(Ga)As epitaxy or Al(Ga)Sb/In(Ga)As/Al(Ga)Sb epilayers to be grown on a GaAs/Ge(Si) heterostructure or various substrates. A cheaper substrate, such as Si, Ge, GaAs, or Ge/Si substrate, may be used with the techniques described herein, and In(Ga)As or Al(Ga)Sb/InAs/Al(Ga)Sb epilayers may be directly grown on cheaper substrates. In some examples, Al(Ga)Sb/In(Ga)As/Al(Ga)Sb heterostructures can be directly grown on a silicon substrate, gallium arsenic substrate, germanium substrate, or Ge/Si substrate by MOCVD operations.

In one embodiment, a method comprises providing a substrate, forming a prelayer over the substrate, forming over the prelayer a barrier layer that includes one of GaAs and InGaAs, and forming a channel layer over the barrier layer.

These aspects and other embodiments may include one or more of the following features. The substrate may comprise a gallium arsenide substrate, a silicon substrate, a germanium substrate, or a Ge/Si substrate. Each of the prelayer, barrier layer, and channel layer may be provided using metal organic chemical vapor deposition (MOCVD) operations. The prelayer may comprise a graded-temperature arsenic prelayer grown with graded temperature ramped from 300 to 550° C. The prelayer thickness may be less than 10 nanometers. The barrier layer may comprise GaAs with low-growth-temperature growth or an $In_xGa_{1-x}As$ epitaxy with one or more GaAs-based layers. The barrier layer thickness may be about 5-500 nanometers. The barrier layer may be slightly P or N-type. The channel layer may comprise an InAs epitaxy with low-growth-temperature growth or Al(In)Sb/InAs/Al(In)Sb heterostructures with one or more pairs deposited at a temperature of about 300 to 600° C. The channel thickness may be about 20-500 nanometers. Periodic 90° misfit dislocations may be generated between the barrier and the channel layers to relax the strain. The channel layer may be used for the deposition of high-performance electron devices such as a tunneling field-effect transistor (TFET).

In another embodiment, a method comprises providing a substrate, forming a prelayer over the substrate, forming a barrier over the prelayer, and forming over the barrier layer a channel layer that includes one of InAs and an Sb-based heterostructure.

These aspects and other embodiments may include one or more of the following features. Each of the prelayer, barrier layer, and channel layer may have been grown using metal organic chemical vapor deposition (MOCVD) operations. The prelayer may have been grown with graded temperature ramped from 300 to 550° C. The prelayer thickness may be less than 10 nanometers. The barrier layer thickness may be about 5-500 nanometers. The barrier layer may be slightly P or N-type. The channel layer thickness may be about 20-500 nanometers. The wafer may comprise periodic 90° misfit dislocations between the barrier and the channel layers to relax the strain.

In yet another embodiment, a method comprises providing a substrate, forming over the substrate a prelayer at a graded temperature, forming a barrier layer over the prelayer, and forming a channel layer over the barrier layer.

In yet another interrelated embodiment, a structure comprises a substrate, a prelayer over the substrate, a barrier layer over the prelayer, and a channel layer over the barrier layer, the channel layer including a heterostructure comprising InAs.

These aspects and other embodiments may include one or more of the following features. The channel layer includes a pair of layers of common composition and an InAs layer between the pair of layers, where the InAs layer is of different composition tan the pair of layers. The heterostructure includes AlSb, AlGaSb, AlInSb, or InAs. The channel layer is disposed within a transistor. The barrier layer is slightly P-type or slightly N-type. The prelayer includes arsenic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:

a barrier layer comprising $In_xGa_{1-x}As$;

wherein the barrier layer is between a substrate and a non-$In_xGa_{1-x}As$ channel layer, is doped, and a concentration of dopant in the barrier layer is in an order of $10^{17}$ $cm^{-3}$.

2. The structure of claim 1, wherein the channel layer includes a pair of layers of common composition and an InAs layer between the pair of layers, the InAs layer of different composition than the pair of layers.

3. The structure of claim 1, wherein the channel layer is disposed within a transistor.

4. The structure of claim 1, wherein the barrier layer is P-type or N-type.

5. A structure comprising:

a barrier layer including $In_xGa_{1-x}As$; and a non-$In_xGa_{1-x}As$ channel layer;

wherein the barrier layer is between a substrate and the channel layer, is doped, and a concentration of dopant in the barrier layer is in an order of $10^{17}$ $cm^{-3}$.

6. The structure of claim 5, wherein the channel layer includes a pair of layers of common composition and an InAs layer between the pair of layers, the InAs layer of different composition than the pair of layers.

7. The structure of claim 5, wherein the channel layer includes AlSb.

8. The structure of claim 5, wherein the channel layer includes AlGaSb.

9. The structure of claim 5, wherein the channel layer includes AlInSb.

10. The structure of claim 5, wherein the channel layer includes InAs.

11. A structure comprising:

a barrier layer including $In_xGa_{1-x}As$; and a non-$In_xGa_{1-x}As$ channel layer including a heterostructure comprising InAs;

wherein the barrier layer is between a substrate and the channel layer, is doped, and a concentration of dopant in the barrier layer is in an order of $10^{17}$ $cm^{-3}$.

12. The structure of claim 11, wherein the channel layer includes a pair of layers of common composition and an InAs layer between the pair of layers, the InAs layer of different composition than the pair of layers.

13. The structure of claim 11, wherein the heterostructure includes AlSb.

14. The structure of claim 11, wherein the heterostructure includes AlGaSb.

15. The structure of claim 11, wherein the heterostructure includes AlInSb.

16. The structure of claim 11, wherein the heterostructure includes InAs.

17. The structure of claim 11, wherein the channel layer is disposed within a transistor.

18. The structure of claim 11, wherein the barrier layer is P-type or N-type.

19. The structure of claim 11, further comprising a prelayer including arsenic.

20. The structure of claim 1, wherein the barrier layer includes an $In_xGa_{1-x}As$ epitaxy layer with one or multiple GaAs-based layers.

* * * * *